(12) United States Patent
Masuda et al.

(10) Patent No.: US 6,917,242 B2
(45) Date of Patent: Jul. 12, 2005

(54) POWER AMPLIFIER

(75) Inventors: Toshihiko Masuda, Tokyo (JP);
Kazunobu Ohkuri, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/466,927

(22) PCT Filed: Nov. 7, 2002

(86) PCT No.: PCT/JP02/11597

§ 371 (c)(1),
(2), (4) Date: Jun. 25, 2004

(87) PCT Pub. No.: WO03/044947

PCT Pub. Date: May 30, 2003

(65) Prior Publication Data

US 2004/0263244 A1 Dec. 30, 2004

(30) Foreign Application Priority Data

Nov. 19, 2001 (JP) .......................... 2001-352922
Jun. 4, 2002 (JP) .......................... 2002-162437

(51) Int. Cl.[7] ............................................... H03F 3/38
(52) U.S. Cl. .......................................... 330/10; 330/251
(58) Field of Search .......................... 330/10, 251, 146, 330/207 A

(56) References Cited

U.S. PATENT DOCUMENTS 4,810,912 A * 3/1989 Theus et al. ................. 327/437
5,398,003 A * 3/1995 Heyl et al. ..................... 330/10
5,617,058 A * 4/1997 Adrian et al. .................. 330/10
6,104,248 A * 8/2000 Carver ......................... 330/297

FOREIGN PATENT DOCUMENTS

| JP | 2001-185961 A | 7/2001 |
| JP | 2001-292040 A | 10/2001 |
| JP | 2002-158544 A1 | 5/2002 |
| JP | 2002-158549 A | 5/2002 |

* cited by examiner

Primary Examiner—Patricia Nguyen
(74) Attorney, Agent, or Firm—Wolf, Greenfield & Sacks PC

(57) ABSTRACT

A power amplifier for reducing emission generated at the edges of output voltages. A pair of PWM modulation circuits (11) and (12) to which an input signal is sent; a pair of push-pull circuits (15) and (16); and drive circuits (13) and (14) for sending the outputs of the PWM modulation circuits (11) and (12) as drive signals to the push-pull circuits (15) and (16) are provided. A speaker (19) is connected between the output end of the push-pull circuit (15) and the output end of the push-pull circuit (16). The drive circuits (13) and (14) are switched at intervals equal to the cycle period of pulse modulation signals such that the drive signals sent to the push-pull circuits (15) and (16) are not changed at the end points of each cycle period of the pulse modulation signals.

16 Claims, 11 Drawing Sheets

FIG. 4

| ADDRESS m | | DATA | | | | | | | | | | | |
|---|---|---|---|---|---|---|---|---|---|---|---|---|---|
| A6 | A5~A0 | D63 | D62 | D61 | D60 | D59 | D58 | ... | D5 | D4 | D3 | D2 | D1 | D0 |
| "0" (0) | 32 | ‡ | ‡ | ‡ | ‡ | ‡ | ‡ | | ‡ | ‡ | ‡ | ‡ | ‡ | ‡ |
| | 33 | 1 | 0 | 0 | 0 | 0 | 0 | | 0 | 0 | 0 | 0 | 0 | 0 |
| | 34 | 1 | 1 | 0 | 0 | 0 | 0 | | 0 | 0 | 0 | 0 | 0 | 0 |
| | 35 | 1 | 1 | 1 | 0 | 0 | 0 | | 0 | 0 | 0 | 0 | 0 | 0 |
| | 36 | 1 | 1 | 1 | 1 | 0 | 0 | | 0 | 0 | 0 | 0 | 0 | 0 |
| | 37 | 1 | 1 | 1 | 1 | 1 | 0 | | 0 | 0 | 0 | 0 | 0 | 0 |
| | ⋮ | | | | | | | | | | | | | |
| | 63 | 1 | 1 | 1 | 1 | 1 | 1 | | 0 | 0 | 0 | 0 | 0 | 0 |
| | 0 | 1 | 1 | 1 | 1 | 1 | 1 | | 0 | 0 | 0 | 0 | 0 | 0 |
| | ⋮ | | | | | | | | | | | | | |
| | 27 | 1 | 1 | 1 | 1 | 1 | 1 | | 1 | 0 | 0 | 0 | 0 | 0 |
| | 28 | 1 | 1 | 1 | 1 | 1 | 1 | | 1 | 1 | 0 | 0 | 0 | 0 |
| | 29 | 1 | 1 | 1 | 1 | 1 | 1 | | 1 | 1 | 1 | 0 | 0 | 0 |
| | 30 | 1 | 1 | 1 | 1 | 1 | 1 | | 1 | 1 | 1 | 1 | 0 | 0 |
| | 31 | 1 | 1 | 1 | 1 | 1 | 1 | | 1 | 1 | 1 | 1 | 1 | 0 |
| "1" (64) | 32 | ‡ | ‡ | ‡ | ‡ | ‡ | ‡ | | ‡ | ‡ | ‡ | ‡ | ‡ | ‡ |
| | 33 | 0 | 0 | 0 | 0 | 0 | 0 | | 0 | 0 | 0 | 0 | 0 | 1 |
| | 34 | 0 | 0 | 0 | 0 | 0 | 0 | | 0 | 0 | 0 | 0 | 1 | 1 |
| | 35 | 0 | 0 | 0 | 0 | 0 | 0 | | 0 | 0 | 0 | 1 | 1 | 1 |
| | 36 | 0 | 0 | 0 | 0 | 0 | 0 | | 0 | 0 | 1 | 1 | 1 | 1 |
| | 37 | 0 | 0 | 0 | 0 | 0 | 0 | | 0 | 1 | 1 | 1 | 1 | 1 |
| | ⋮ | | | | | | | | | | | | | |
| | 63 | 0 | 0 | 0 | 0 | 0 | 0 | | 1 | 1 | 1 | 1 | 1 | 1 |
| | 0 | 0 | 0 | 0 | 0 | 0 | 0 | | 1 | 1 | 1 | 1 | 1 | 1 |
| | ⋮ | | | | | | | | | | | | | |
| | 27 | 0 | 0 | 0 | 0 | 0 | 1 | | 1 | 1 | 1 | 1 | 1 | 1 |
| | 28 | 0 | 0 | 0 | 0 | 1 | 1 | | 1 | 1 | 1 | 1 | 1 | 1 |
| | 29 | 0 | 0 | 0 | 1 | 1 | 1 | | 1 | 1 | 1 | 1 | 1 | 1 |
| | 30 | 0 | 0 | 1 | 1 | 1 | 1 | | 1 | 1 | 1 | 1 | 1 | 1 |
| | 31 | 0 | 1 | 1 | 1 | 1 | 1 | | 1 | 1 | 1 | 1 | 1 | 1 |

Pc — DIGITAL AUDIO SIGNAL

FIG. 5

| | TWO'S COMPLEMENT | | | | | | NATURAL NUMBER |
|---|---|---|---|---|---|---|---|
| -31 | 1 | 0 | 0 | 0 | 0 | 1 | 33 |
| -30 | 1 | 0 | 0 | 0 | 1 | 0 | 34 |
| -29 | 1 | 0 | 0 | 0 | 1 | 1 | 35 |
| -28 | 1 | 0 | 0 | 1 | 0 | 0 | 36 |
| ⋮ | | | ⋮ | | | | ⋮ |
| -3 | 1 | 1 | 1 | 1 | 0 | 1 | 61 |
| -2 | 1 | 1 | 1 | 1 | 1 | 0 | 62 |
| -1 | 1 | 1 | 1 | 1 | 0 | 1 | 63 |
| 0 | 0 | 0 | 0 | 0 | 0 | 0 | 0 |
| 1 | 0 | 0 | 0 | 0 | 0 | 1 | 1 |
| 2 | 0 | 0 | 0 | 0 | 1 | 0 | 2 |
| 3 | 0 | 0 | 0 | 0 | 1 | 1 | 3 |
| ⋮ | | | ⋮ | | | | ⋮ |
| 28 | 0 | 1 | 1 | 1 | 0 | 0 | 28 |
| 29 | 0 | 1 | 1 | 1 | 0 | 1 | 29 |
| 30 | 0 | 1 | 1 | 1 | 1 | 0 | 30 |
| 31 | 0 | 1 | 1 | 1 | 1 | 1 | 31 |

POWER AMPLIFIER

TECHNICAL FIELD

The present invention relates to power amplifiers.

BACKGROUND ART

Class-D amplifiers serve as audio power amplifiers. The class-D amplifiers amplify electric power by switching, and are structured, for example, as shown in FIG. 10.

More specifically, a digital audio signal Pin is sent through an input terminal Tin to PWM (pulse width modulation) modulation circuits 11 and 12, and the input signal Pin is converted to a pair of PWM signals PA and PB.

In this case, the pulse widths of the PWM signals PA and PB are changed according to the level (the level of each sample of the original analog signal converted to the signal Pin) indicated by the input signal Pin. As shown in FIG. 12, the pulse width of one PWM signal PA has a magnitude corresponding to the level indicated by the input signal Pin, and the pulse width of the other PWM signal PB has a magnitude corresponding to the two's complement of the level indicated by the input signal Pin. In the PWM signals PA and PB, their rising edges are fixed to the start point of one cycle period (reference period) Tc of the PWM signals PA and PB, and their falling edges are shifted according to the level indicated by the input signal Pin.

The carrier frequency fc (=1/Tc) of the PWM signals PA and PB is set, for example, to 16 times the sampling frequency fs of the input digital audio signal Pin. When fs is 48 kHz, fc=16 fs=16×48 kHz=768 kHz.

Such a PWM signal PA is sent to a drive circuit 13, and a pair of drive voltages +PA and −PA which are the signal PA and a signal having the same level as the signal PA with the inverted polarities is formed as shown in FIG. 11A. These drive voltages +PA and −PA are sent to the gates of a pair of n-channel MOS-FETs (metal oxide semiconductor type field effect transistors) (Q11 and Q12). In this case, the FETs (Q11 and Q12) constitute a push-pull circuit 15. The drain of the FET (Q11) is connected to a power-supply terminal TPWR, the source of the FET (Q11) is connected to the drain of the FET (Q12), and the source of the FET (Q12) is connected to the ground. To the power-supply terminal TPWR, a stable DC voltage +VDD is supplied as a power-supply voltage. The voltage +VDD ranges, for example, from 20 V to 50 V.

The source of the FET (Q11) and the drain of the FET (Q12) are connected to one end of a speaker 19 through a low-pass filter 17 formed of a coil and a capacitor.

The PWM signal PB sent from the PWM modulation circuit 11 also passes through in the same way as the PWM signal PA. More specifically, the PWM signal PB is sent to a drive circuit 14, and a pair of drive voltages +PB and −PB which are the signal PB and a signal having the same level as the signal PB with the inverted polarities is formed as shown in FIG. 11B. These drive voltages +PB and −PB are sent to the gates of a pair of n-channel MOS-FETs (Q13 and Q14) constituting a push-pull circuit 16.

The source of the FET (Q13) and the drain of the FET (Q14) are connected to the other end of the speaker 19 through a low-pass filter 18 formed of a coil and a capacitor.

Therefore, when +PA="H", −PA="L", the FET (Q11) is turned on, and the FET (Q12) is turned off. Consequently, a voltage VA generated at the connection point of the FETs (Q11 and Q12) is the voltage +VDD, as shown in FIG. 1C. Conversely, when +PA="L", −PA="H", the FET (Q11) is turned off, and the FET (Q12) is turned on. Consequently, VA=0.

In the same way, when +PB="H", −PB="L", the FET (Q13) is turned on, and the FET (Q14) is turned off. Consequently, a voltage VB generated at the connection point of the FETs (Q13 and Q14) is the voltage +VDD, as shown in FIG. 11D. Conversely, when +PB="L", −PB="H", the FET (Q13) is turned off, and the FET (Q14) is turned on. Consequently, VB=0.

In a period when VA=+VDD and VB=0, as shown in FIG. 10 and FIG. 11E, current "i" flows from the connection point of the FETs (Q11 and Q12) to the connection point of the FETs (Q13 and Q14) through a line from the low-pass filter 17 through the speaker 19 to the low-pass filter 18.

In a period when VA=0 and VB=+VDD, the current "i" flows from the connection point of the FETs (Q13 and Q14) to the connection point of the FETs (Q11 and Q12) through a line from the low-pass filter 18 through the speaker 19 to the low-pass filter 17, in the direction reverse to that shown in FIG. 10. In a period when VA=VB=+VDD and in a period when VA=VB=0, the current "i" does not flow. In other words, the push-pull circuits 15 and 16 form a BTL (bridged-tied load) circuit.

The periods when the current "i" flows is changed according to the periods when the original PWM signals PA and PB are at "H". When the current "i" flows through the speaker 19, the current "i" is integrated by the low-pass filters 17 and 18. As a result, the current "i" flowing through the speaker 19 is the analog current which corresponds to the level indicated by the input signal Pin and of which the electric power has been amplified. In other words, the electric-power-amplified output is sent to the speaker 19.

The circuit shown in FIG. 10 functions as a power amplifier in this way. The FETs (Q11 to Q14) switch the power-supply voltage +VDD according to the input digital audio signal Pin to amplify the electric power. Therefore, a high efficiency and a large output are obtained.

Since the above-described power amplifier switches the power-supply voltage +VDD at a high speed to generate the output voltages VA and VB, as also shown in FIG. 11C and FIG. 11D, extraneous emission occurs at the rising edges and the falling edges of the output voltages VA and VB. In addition, when switching is achieved, since the power-supply voltage +VDD is as high as, for example, 20 V to 50 V, its emission level is quite high. The carrier frequency Fc of the PWM signals PA and PB is, for example, 768 kHz as in the above case, and is included in the band of medium-wave broadcasting.

Therefore, when a class-D power amplifier such as that described above is integrated with a receiver as in car audio systems or is disposed close to a receiver, emission caused at the rising edges and the falling edges of the output voltages VA and VB disturbs broadcasting receiving. Since the rising edges and the falling edges of the output voltages VA and VB are steep and include many harmonics, the harmonics are also emitted, which may disturb receiving at FM receivers and TV receivers.

An object of the present invention is to provide a power amplifier having a reduced level of such emission.

DISCLOSURE OF THE INVENTION

In the present invention, for example, a first pulse modulation circuit for converting an input signal to a first pulse modulation signal which indicates the level of the input signal to output it;

a second pulse modulation circuit for converting the input signal to a second pulse modulation signal which indicates the complement of the level of the input signal to output it;

first and second push-pull circuits structured such that a pair of switching elements are push-pull-connected; and first to fourth selector circuits for selectively sending the outputs of the first and second pulse modulation circuits to the pairs of switching elements of the first and second push-pull circuits as drive signals, are included, a load is connected between the output end of the first push-pull circuit and the output end of the second push-pull circuit, and the first to fourth selector circuits are switched at intervals equal to the cycle period of the first and second pulse modulation signals such that the drive signal sent to each of the switching elements is not changed at the end points of each cycle period of the first and second pulse modulation signals.

Therefore, the number of the rising edges and the falling edges of the output voltages of the push-pull circuits is halved, and emission is reduced.

BRIEF DESCRIPTION OF THE DRAWINGS

FIG. 4 is a view showing an example data table.

FIG. 5 is a view used for describing the relationship between a signal and an address.

BEST MODE FOR CARRYING OUT THE INVENTION

Figure 1:
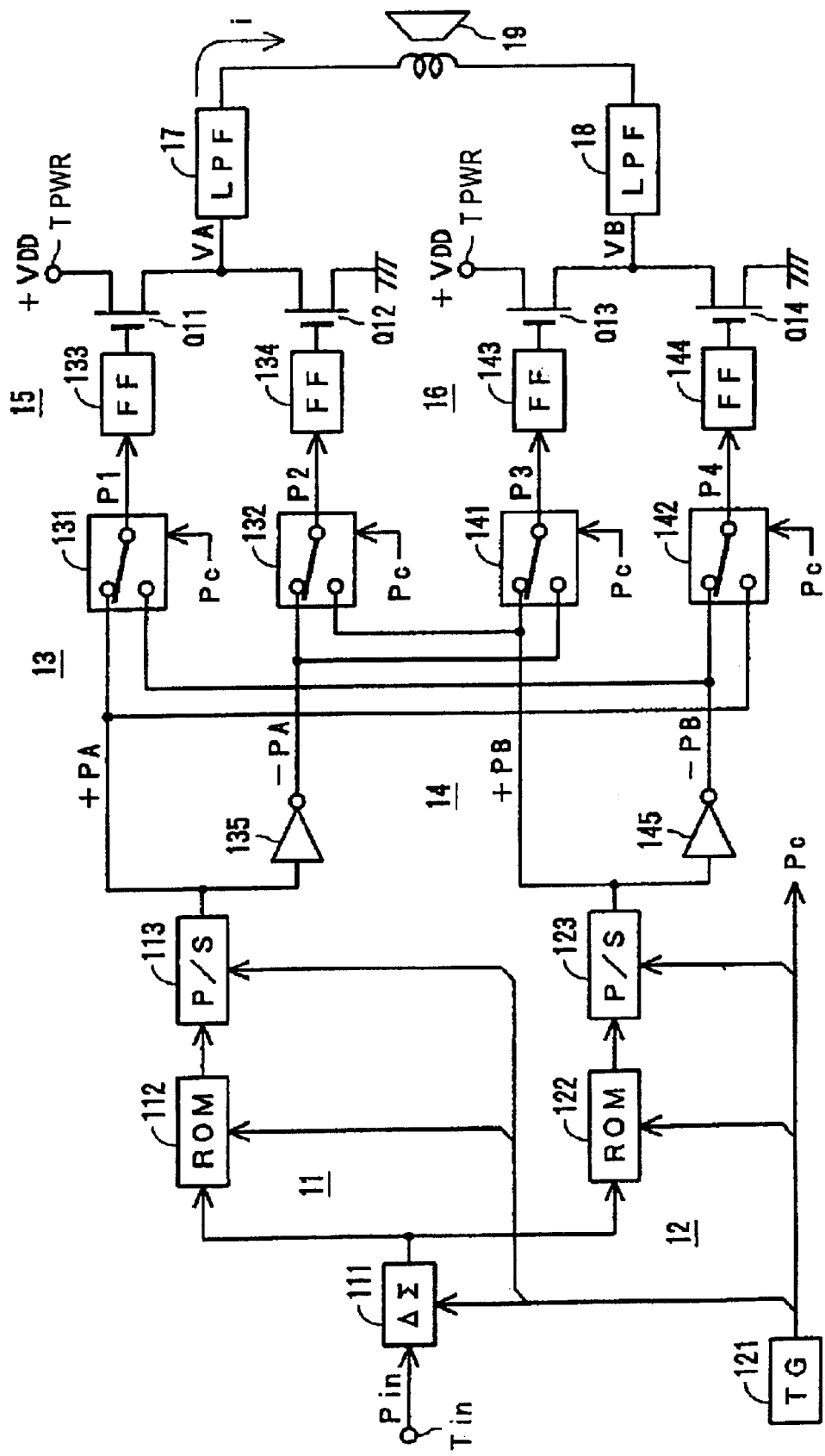
FIG. 1 is a systematic view showing an embodiment of the present invention.

FIG. 1 shows an example class-D power amplifier according to the present invention. In this example, a digital audio signal Pin is sent through an input terminal Tin to a ΔΣ modulation circuit 111. The ΔΣ modulation circuit 111 constitutes a first PWM modulation circuit 11 together with a ROM (read only memory) 112 and a parallel-input-serial-output shift register 113, and constitutes a second PWM modulation circuit 12 together with a ROM 122 and a parallel-input-serial-output shift register 123. The digital audio signal Pin is converted to PWM signals +PA and +PB, such as those shown in FIG. 2A and FIG. 2B, by the PWM modulation circuits 11 and 12.

Figure 12:
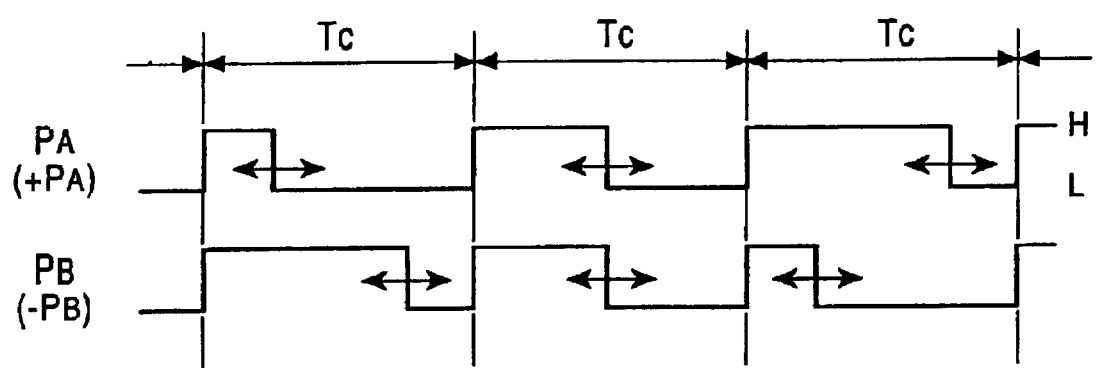
FIG. 12 is a waveform view used for describing the circuit shown in FIG. 10.

In this case, the pulse widths of the PWM signals +PA and +PB are changed according to the level indicated by the input signal Pin. As shown in FIG. 12, the pulse width of one PWM signal +PA has a magnitude corresponding to the level indicated by the input signal Pin, and the pulse width of the other PWM signal +PB has a magnitude corresponding to the two's complement, for example, of the level indicated by the input signal Pin. In the PWM signals +PA and +PB, their rising edges are fixed to the start point of one cycle period Tc of the PWM signals +PA and +PB, and their falling edges are shifted according to the level indicated by the audio signal Pin.

The carrier frequency fc (=1/Tc) of the PWM signals +PA and +PB is set, for example, to 16 times the sampling frequency fs of the digital audio signal Pin. When fs is 48 kHz, fc=16 fs=16×48 kHz=768 kHz.

To generate such PWM signals +PA and +PB, in the PWM modulation circuit 11, the digital audio signal Pin is sent from the input terminal Tin to the ΔΣ modulation circuit 111, and is converted to a digital audio signal having reduced quantization noise in the audio frequency band while having a reduced number of bits, such as a digital audio signal having a quantization frequency (=fc) of 16 fs and six quantization bits. The digital audio signal is sent to the ROM 112, and is converted to parallel digital data corresponding to the quantization level. The parallel digital data is sent to the shift register 113, and is converted to a serial signal, that is, the PWM signal +PA.

In the PWM modulation circuit 12, the digital audio signal output from the ΔΣ modulation circuit 111 is sent to the ROM 122, and is converted to parallel digital data corresponding to the two's complement of the level of the digital audio signal. The parallel digital data is sent to the shift register 123, and is converted to a serial signal, that is, the PWM signal +PB.

In this case, a timing-signal generation circuit 121 generates various timing signals, and sends the timing signals to the circuits 111 to 113, 122, and 123.

Figure 11:
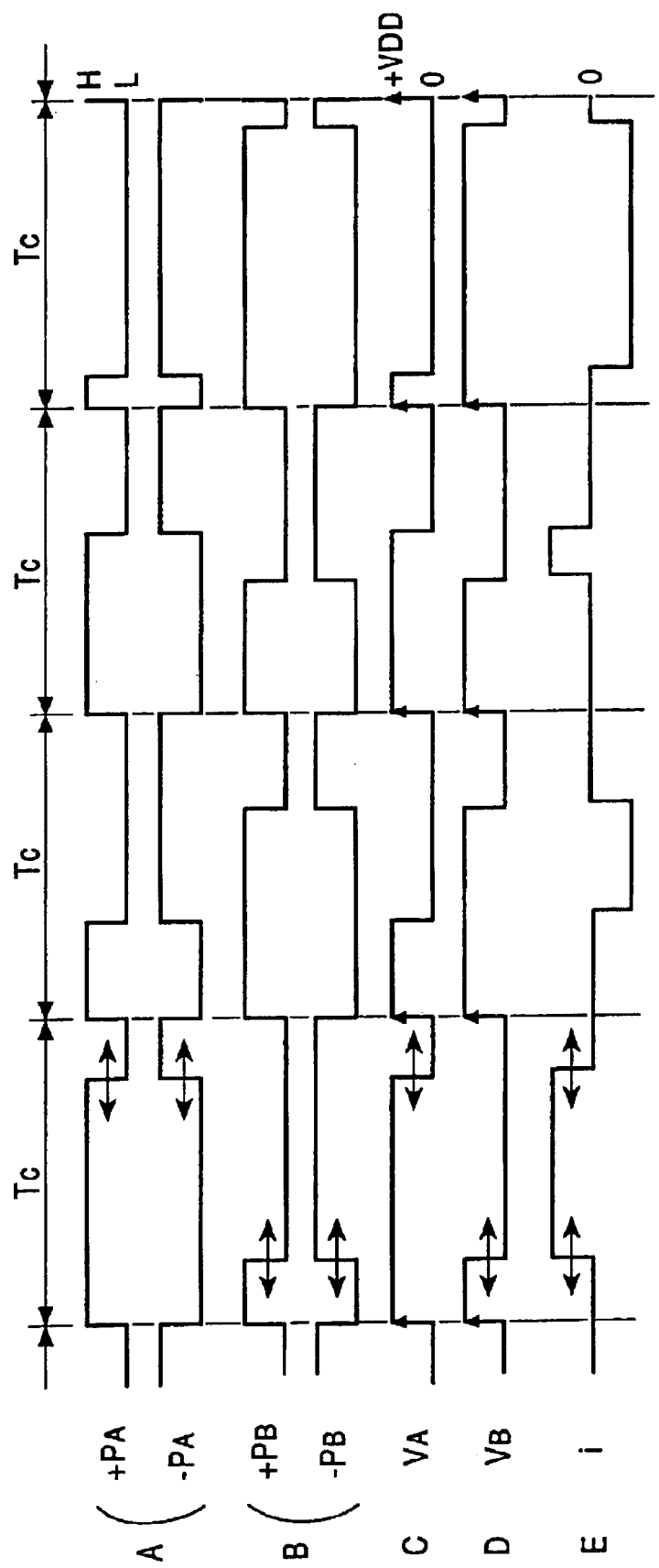
FIG. 11 is a waveform view used for describing a circuit shown in FIG. 10.

The PWM signals +PA and +PB are sent to drive circuits 13 and 14 to generate drive voltages P1 to P4. More specifically, the PWM signal +PA is sent to selector circuits 131 and 142; is also sent to an inverter 135 to generate a level-inverted PWM signal −PA, as shown in FIG. 2A; and the PWM signal −PA is sent to selector circuits 132 and 141. The PWM signal +PB is sent to the selector circuits 141 and 132; is also sent to an inverter 145 to generate a level-inverted PWM signal −PB, as shown in FIG. 2B; and the PWM signal −PB is sent to the selector circuits 142 and 131. FIG. 2A and FIG. 2B are the same as FIG. 11A and FIG. 11B.

Further, the timing-signal generation circuit 121 outputs a signal Pc having a level inverted every cycle period Tc as shown in FIG. 2C, and the signal Pc is sent to the selector circuits 131, 132, 141, and 142 as a switching control signal.

Then, the selector circuits 131 and 132 output, as shown in FIG. 2D, the signals +PA and −PA as the drive voltages P1 and P2 during periods Tc when Pc="L", and the signals −PB and +PB as the drive voltages P1 and P2 during periods Tc when Pc="H". The selector circuits 141 and 142 output, as shown in FIG. 2E, the signals +PB and −PB as the drive voltages P3 and P4 during periods Tc when Pc="L", and the signals −PA and +PA as the drive voltages P3 and P4 during periods Tc when Pc="H".

These drive voltages P1, P2, P3, and P4 are shaped by flip-flop circuits 133, 134, 143, and 144, and the drive voltages P1 and P2 are sent to the gates of a pair of switching elements, such as n-channel MOS-FETs (Q11 and Q12). In this case, the FETs (Q11 and Q12) constitute a push-pull circuit 15. The drain of the FET (Q11) is connected to a power-supply terminal TPWR, the source of the FET (Q11) is connected to the drain of the FET (Q12), and the source of the FET (Q12) is connected to the ground. To the power-supply terminal TPWR, a stable DC voltage +VDD, such as a DC voltage ranging from 20 V to 50V, is supplied as a power-supply voltage.

The source of the FET (Q11) and the drain of the FET (Q12) are connected to one end of a speaker 19 through a low-pass filter 17 formed, for example, of a coil and a capacitor.

The drive voltages P3 and P4 sent from the drive circuit 14 also pass through in the same way as the drive voltages P1 and P2. More specifically, the drive voltages P3 and P4 are sent to a pair of n-channel MOS-FETs (Q13 and Q14) constituting a push-pull circuit 16. The source of the FET (Q13) and the drain of the FET (Q14) are connected to the other end of the speaker 19 through a low-pass filter 18 formed of a coil and a capacitor.

With such a structure, when P1="H", P2 ="L", the FET (Q11) is turned on, and the FET (Q12) is turned off. Consequently, a voltage VA generated at the connection point of the FETs (Q11 and Q12) is the voltage +VDD, as shown in FIG. 2F.

Conversely, when P1="L", P2="H", the FET (Q11) is turned off, and the FET (Q12) is turned on. Consequently, VA=0.

In the same way, when P3="H", P4="L", the FET (Q13) is turned on, and the FET (Q14) is turned off. Consequently, a voltage VB generated at the connection point of the FETs (Q13 and Q14) is the voltage +VDD, as shown in FIG. 2G. Conversely, when P3="L", P4="H", the FET (Q13) is turned off, and the FET (Q14) is turned on. Consequently, VB=0.

In a period when VA=+VDD and VB=0, as shown in FIG. 1 and FIG. 2H, current "i" flows from the connection point of the FETs (Q11 and Q12) to the connection point of the FETs (Q13 and Q14) through a line from the low-pass filter 17 through the speaker 19 to the low-pass filter 18.

In a period when VA=0 and VB=+VDD, the current "i" flows from the connection point of the FETs (Q13 and Q14) to the connection point of the FETs (Q11 and Q12) through a line from the low-pass filter 18 through the speaker 19 to the low-pass filter 17, in the direction reverse to that shown in FIG. 1. In a period when VA=VB=+VDD and in a period when VA=VB =0, the current "i" does not flow. In other words, the push-pull circuits 15 and 16 form a BTL circuit.

The periods when the current "i" flows is changed according to the periods when the original PWM signals +PA and +PB are at "H". When the current "i" flows through the speaker 19, the current "i" is integrated by the low-pass filters 17 and 18. As a result, the current "i" flowing through the speaker 19 is the analog current which corresponds to the level indicated by the digital audio signal Pin and of which the electric power has been amplified. Therefore, the circuit shown in FIG. 1 functions as a class-D power amplifier, and the electric-power-amplified output is sent to the speaker 19.

Figure 2:
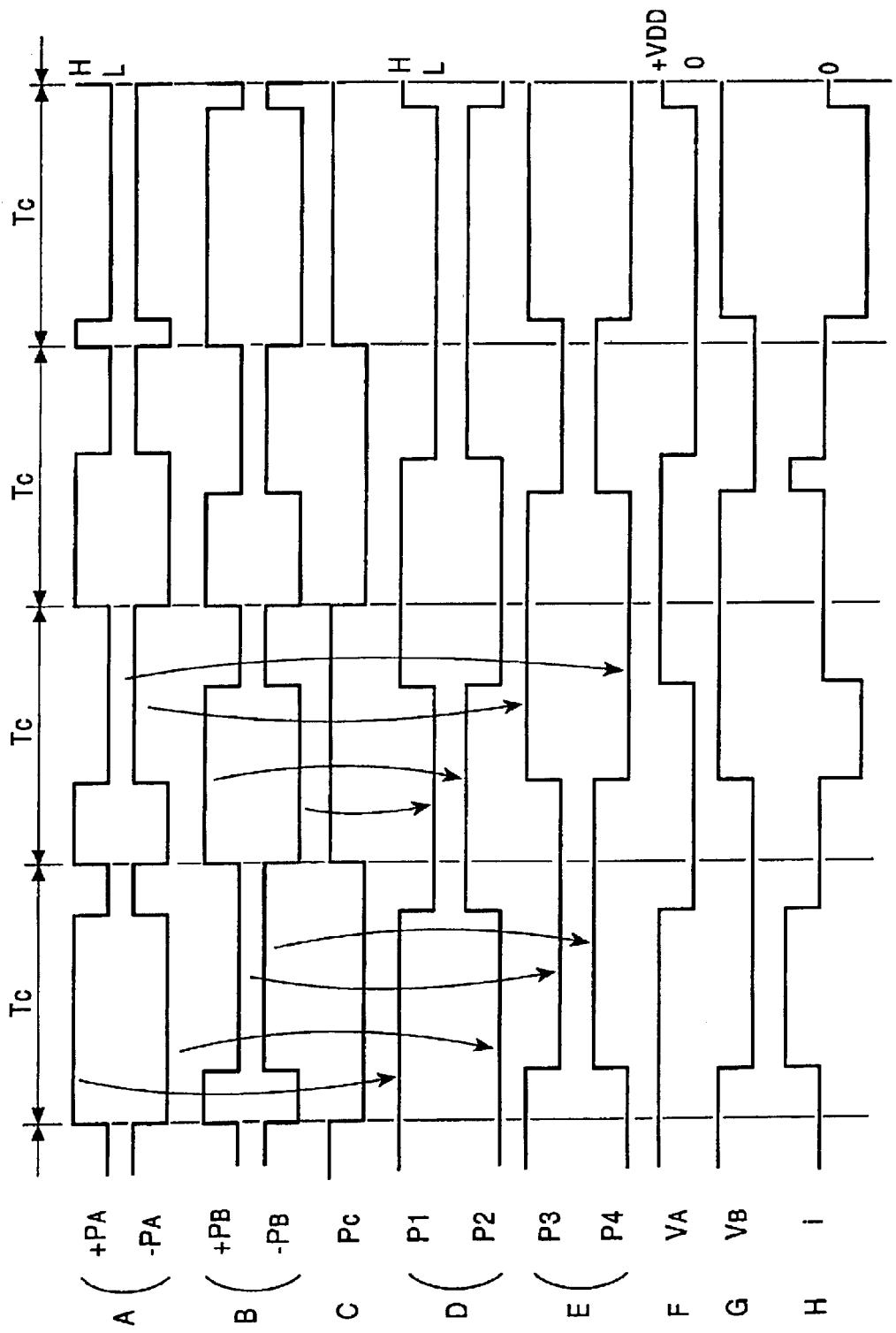
FIG. 2 is a waveform view used for describing a circuit shown in FIG. 1.

In this way, the power amplifier shown in FIG. 1 amplifies electric power by switching. As also shown in FIG. 2, the PWM signals +PA and +PB rise and fall once per cycle period Tc, whereas the output voltages VA and VB rise or fall once per cycle period Tc, the number of the rising edges and the falling edges of the output voltages VA and VB is half the number of the rising edges and the falling edges of the output voltages VA and VB (see FIG. 11C and FIG. 11D) in the power amplifier shown in FIG. 10. Therefore, extraneous emission caused by the changes of the output voltages VA and VB is reduced.

Figure 10:
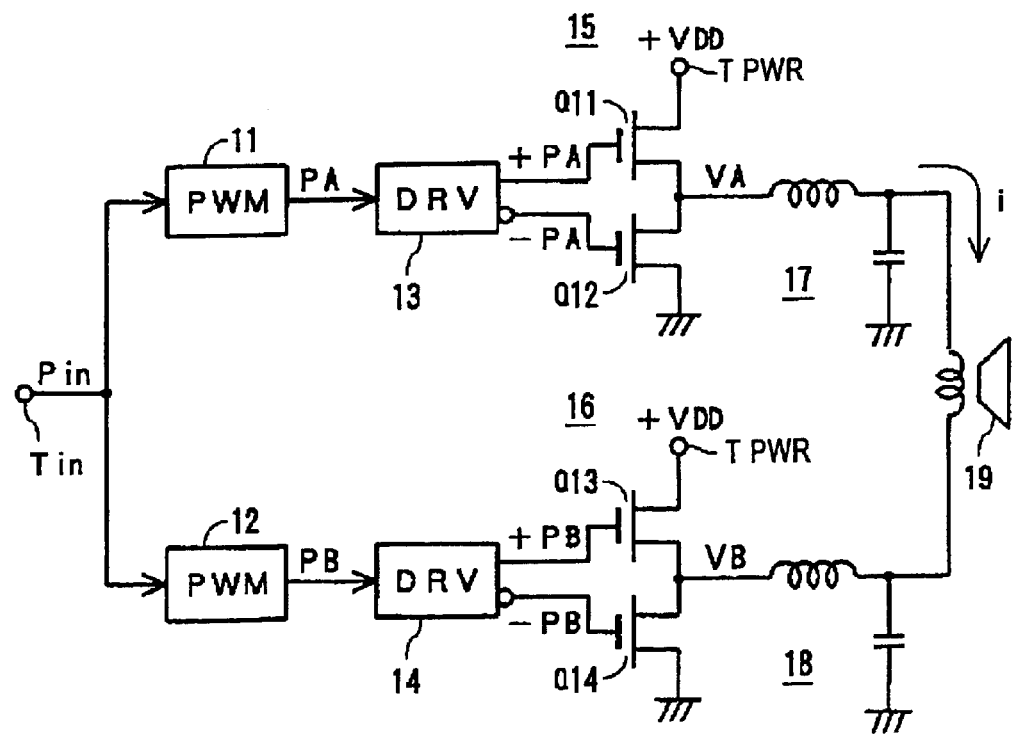
FIG. 10 is a systematic view used for describing the present invention.

Since the frequency of the output voltages VA and VB is half the frequency of the output voltages VA and VB in the power amplifier shown in FIG. 10, even when the power amplifier according to the present embodiment is united with a receiver as in a car audio system, or is disposed close to a receiver, disturbance given to broadcasting receiving, caused by the emission is reduced. Since disturbance given to broadcasting receiving, caused by the emission is reduced in this way, a member used for shielding a receiver from the emission can be eliminated, and cost is reduced. In addition, the power amplifier can be disposed close to a receiver, space is saved.

Further, for example, in the push-pull circuit 15, when the drive voltage P1 falls and the drive voltage P2 rises, if the drive voltage P1 falls with a delay, both drive voltages P1 and P2 are "L" at a period although instantaneously. The FETs (Q11 and Q12) are both ON in this period, and current passes through the FETs (Q11 and Q12).

Since the frequency of the drive voltages P1 to P4 in the power amplifier shown in FIG. 1 is half the frequency in the power amplifier shown in FIG. 10, the number of times current passes through the FETs (Q11 and Q12) or the FETs (Q13 and Q14) when both FETs (Q11 and Q12) or both FETs (Q13 and Q14) are turned on at the same time is halved.

As clear also from FIG. 2, the drive voltages P1 and P2 in the periods when Pc="H" are equivalent to the signal +PA and −PA obtained when the time axis is reversed, and the drive voltages P3 and P4 in the periods when Pc="H" are equivalent to the signal +PB and −PB obtained when the time axis is reversed.

Figure 3:
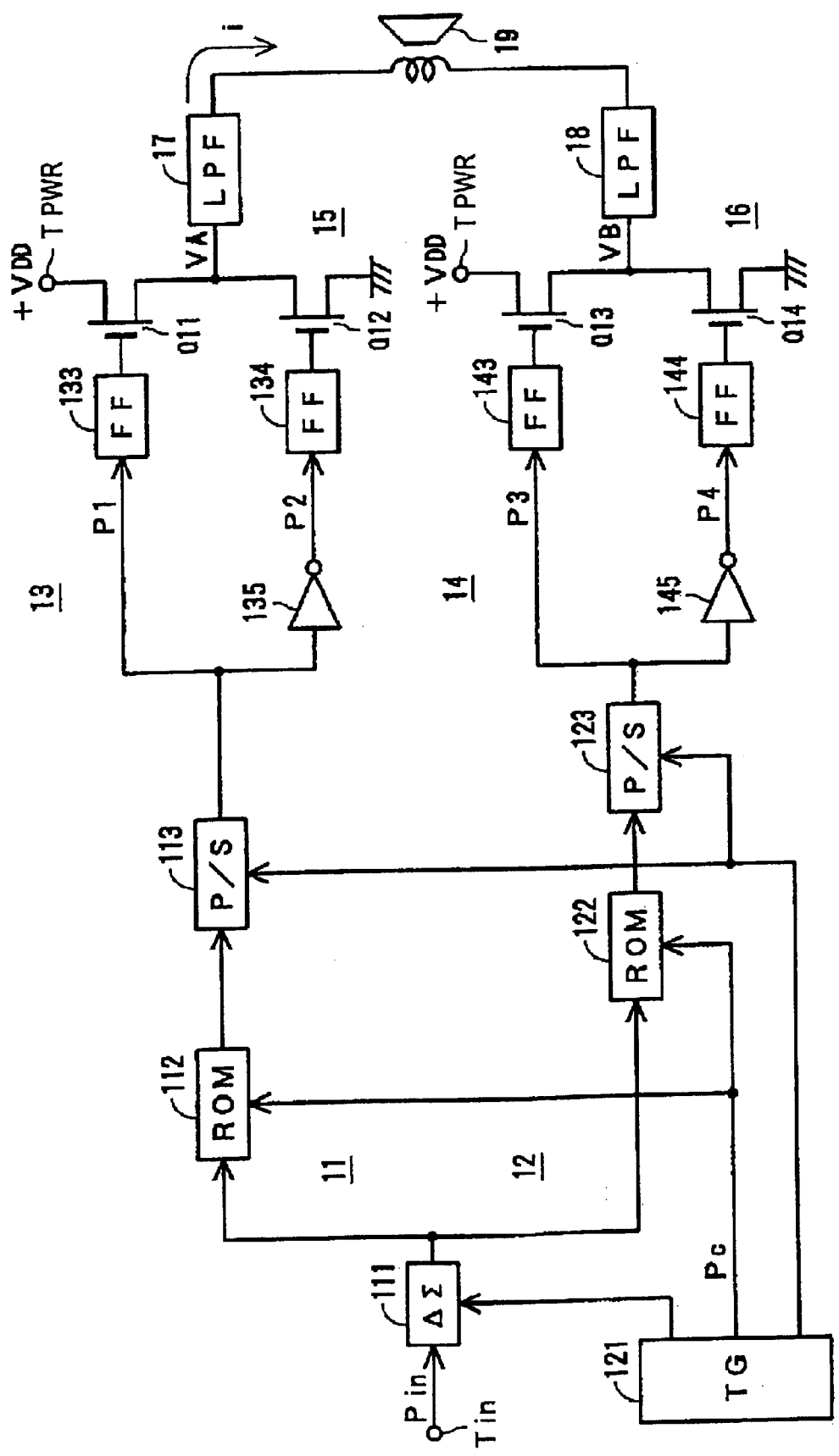
FIG. 3 is a systematic view showing another embodiment of the present invention.

In PWM modulation circuits 11 and 12 shown in FIG. 3, when data read from ROMs 112 and 122 is switched between periods Tc when Pc="L" and periods Tc when Pc="H", drive voltages P1 to P4 have the same waveforms as those shown in FIG. 2.

More specifically, in this case, since a digital audio signal output from a $\Delta\Sigma$ modulation circuit 111 has six bits per sampling, the ROM 112 has the address of seven bits A6 to A0, which is one-bit larger, as shown in FIG. 4. The size of data at each address is 64 bits D63 to D0 corresponding to six bits per sampling.

Since a digital audio signal output from a $\Delta\Sigma$ modulation circuit 111 has six bits per sampling, the digital audio signal has one of 63 values from −31 through 0 to +31, as shown at the left-hand column of FIG. 5. Since the 63 values are expressed by two's complements, they are shown in binary at the middle column of FIG. 5. When it is assumed that these binary numbers are natural binary numbers and converted to decimal numbers, they have values as shown at the right-hand column of FIG. 5.

As shown in FIG. 4, when an address number in the ROM 112 is called "m" ($0 \leq m \leq 127$), the address corresponding to m=32 is not used, and at the addresses corresponding to m=33 to 63, the values having "1" from the most significant bit D63 to the bit D(96-m) and having "0" from the bit D(95-m) to the least significant bit D0 are prepared. At the addresses corresponding to m=0 to 31, the values having "1" from the most significant bit D63 to the bit D(32-m) and having "0" from the bit D(31-m) to the least significant bit D0 are prepared.

Further, the address corresponding to m=(64+32) in the ROM 112 is not used, and at the addresses corresponding to m=(64+33) to (64+63) and (64+0) to (64+31), the values obtained when the higher-order bits and the lower-order bits of the values at the addresses corresponding to m=33 to 63 and 0 to 31 are transposed in their bit arrangement are prepared. More specifically, at the addresses corresponding to m=(64+33) to (64+63), the values having "0" from the most significant bit D63 to the bit D(m-96) and having "1" from the bit D(m-97) to the least significant bit D0 are prepared. At the addresses corresponding to m=(64+0) to (64+–31), the values having "0" from the most significant bit D63 to the bit D(m-32) and having "1" from the bit D(m-33) to the least significant bit D0 are prepared.

Furthermore, the same values are stored at the addresses 0 to 63 in the ROM 122 as those at the addresses 63 to 0 in the ROM 112. The same values are stored at the addresses 64 to 127 in the ROM 122 as those at the addresses 127 to 64 in the ROM 112. The data stored at the addresses 0 to 63 in the ROM 112 and ROM 122 can be stored at the addresses 0 to 63 in the ROM 112 and ROM 122 shown in FIG. 1.

As shown at the bottom of FIG. 4, among the seven-bit address A6 to A0 in the ROM 112 and ROM 122, a digital audio signal output from the ΔΣ modulation circuit 111 is sent to the lower six bits A5 to A0, and the signal Pc, which is inverted every sample period Tc, is sent from a timing-signal generation circuit 121 to the most significant bit A6.

Therefore, as understood also from FIG. 4, since the most significant bit A6 of the address of the ROM 112 is "0" at the periods Tc when Pc="L", data D63 to D0 at the address corresponding to a-digital audio signal sent from the ΔΣ modulation circuit 111 is output among data at the addresses 0 to 63. Since the most significant bit A6 of the address of the ROM 112 is "1" at the periods Tc when Pc="H", data D63 to D0 at the address corresponding to a digital audio signal sent from the ΔΣ modulation circuit 111 is output among data at the addresses (64+0) to (64+63). Then, such data D63 to D0 is sent to a parallel-input-serial-output shift register 113, and is converted to a serial signal.

Figure 6:
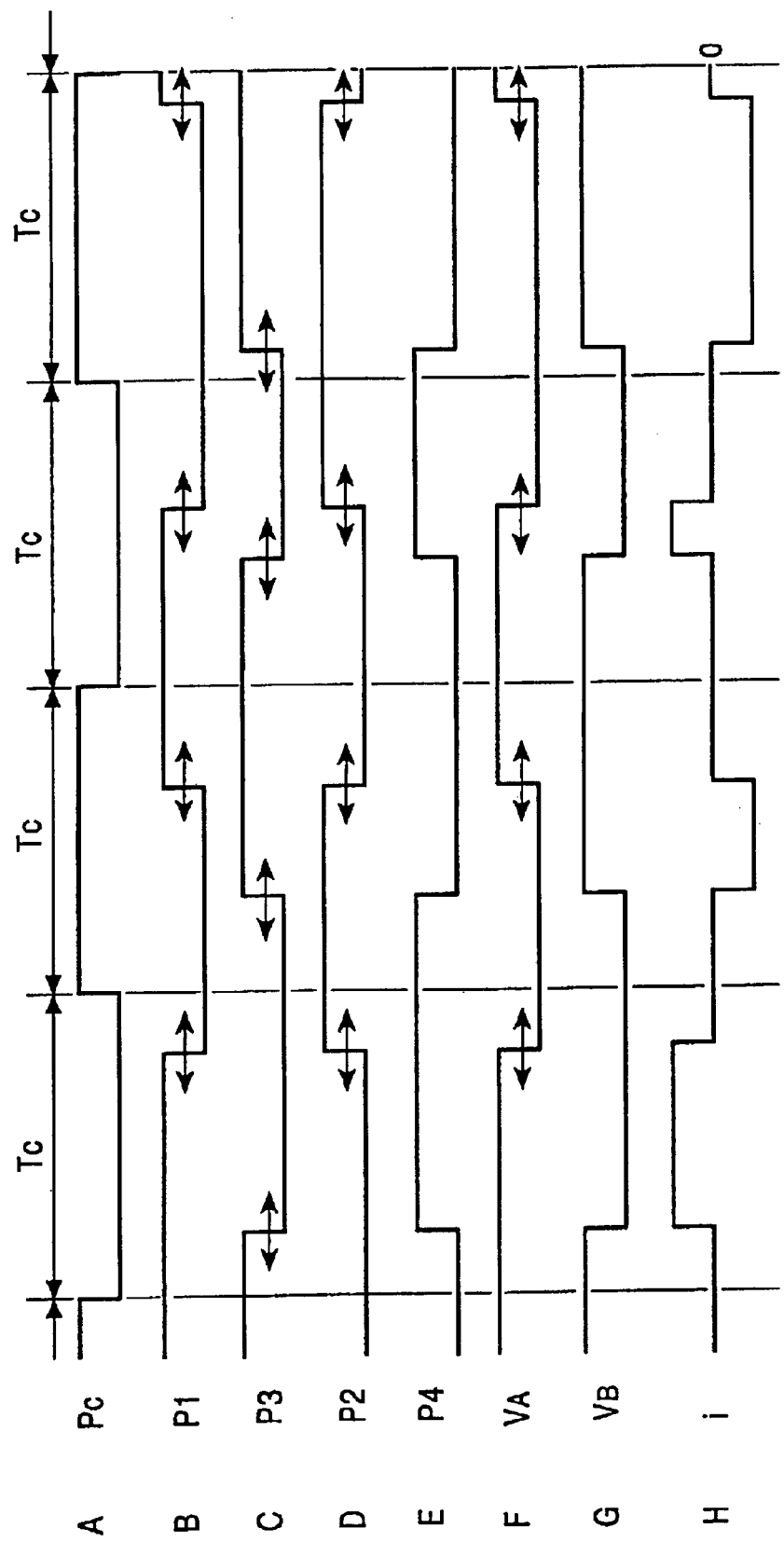
FIG. 6 is a waveform view used for describing a circuit shown in FIG. 3.

Therefore, as shown in FIG. 6B, the serial signal obtained by the conversion is called a PWM signal P1; in periods. Tc when Pc="L", the serial signal has already risen at the start of each period Tc, and the falling point of the serial signal is changed according to the level indicated by the digital audio signal; and in periods Tc when Pc="H", the rising point of the serial signal is changed according to the level indicated by the digital audio signal, and the serial signal has already risen at the end point of each period Tc.

In the ROM 122, since the most significant bit of the address is "1" at the periods Tc when Pc="L", data D63 to D0 at the address corresponding to an input digital audio signal is output among data at the addresses 64 to 127. Since the most significant bit of the address is "0" at the periods Tc when Pc="H", data D63 to D0 at the address corresponding to an input digital audio signal is output among data at the addresses 0 to 63. Then, such data D63 to D0 is sent to a parallel-input-serial-output shift register 123, and is converted to a serial signal.

Therefore, as shown in FIG. 6C, the serial signal obtained by the conversion is called a PWM signal P3; in periods Tc when Pc="L", the serial signal has already risen at the start of each period Tc, and the falling point of the serial signal is changed according to the complement of the level indicated by the digital audio signal; and in periods Tc when Pc="H", the rising point of the serial signal is changed according to the complement of the level indicated by the digital audio signal, and the serial signal has already risen at the end point of each period Tc.

Then, the PWM signal P1 is sent to the gate of an FET (Q11) through a flip-flop circuit 133; and is also sent to an inverter 135, is inverted in level to generate a signal P2 as shown in FIG. 6D, and the signal P2 is sent to the gate of an FET (Q12) through a flip-flop circuit 134. The PWM signal P3 is sent to the gate of an FET (Q13) through a flip-flop circuit 143; and is also sent to an inverter 145, is inverted in level to generate a signal P4 as shown in FIG. 6E, and the signal P4 is sent to the gate of an FET (Q14) through a flip-flop circuit 144.

Therefore, as shown in FIG. 6F and FIG. 6G, a voltage VA generated at the connection point of the FETs (Q11 and Q12) and a voltage VB generated at the connection point of the FETs (Q13 and Q14) are the same as the voltages VA and VB shown in FIG. 2F and FIG. 2G, and current "i" shown in FIG. 6H flows through a speaker 19. As a result, an electric-power-amplified output is sent to the speaker 19.

The power amplifier shown in FIG. 3 obtains the same advantages as the power amplifier shown in FIG. 1, and in addition, can omit the selector circuits 131, 132, 141, and 142 shown in FIG. 1.

Figure 7:
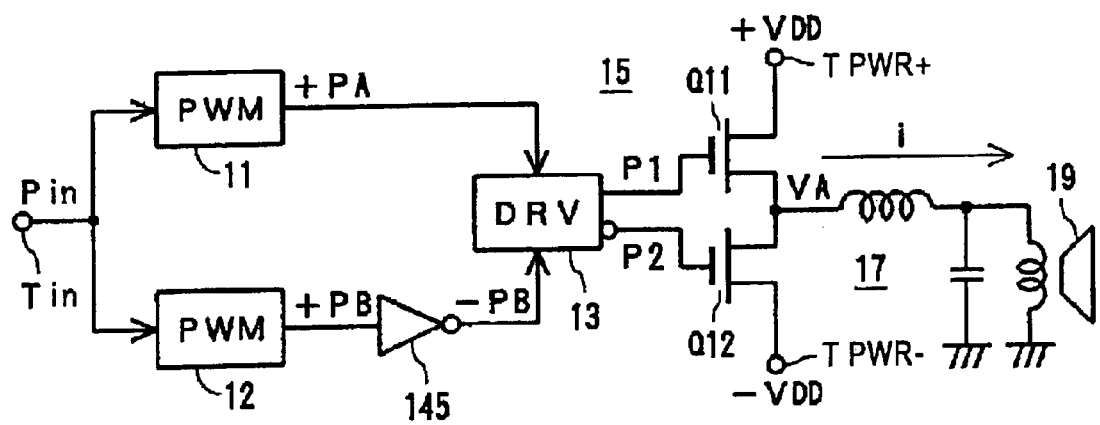
FIG. 7 is a systematic view showing another embodiment of the present invention.

In the foregoing description, the output stage of each power amplifier is the BTL circuit. The output stage can be a single circuit. FIG. 7 shows one form of such a power amplifier.

Figure 8:
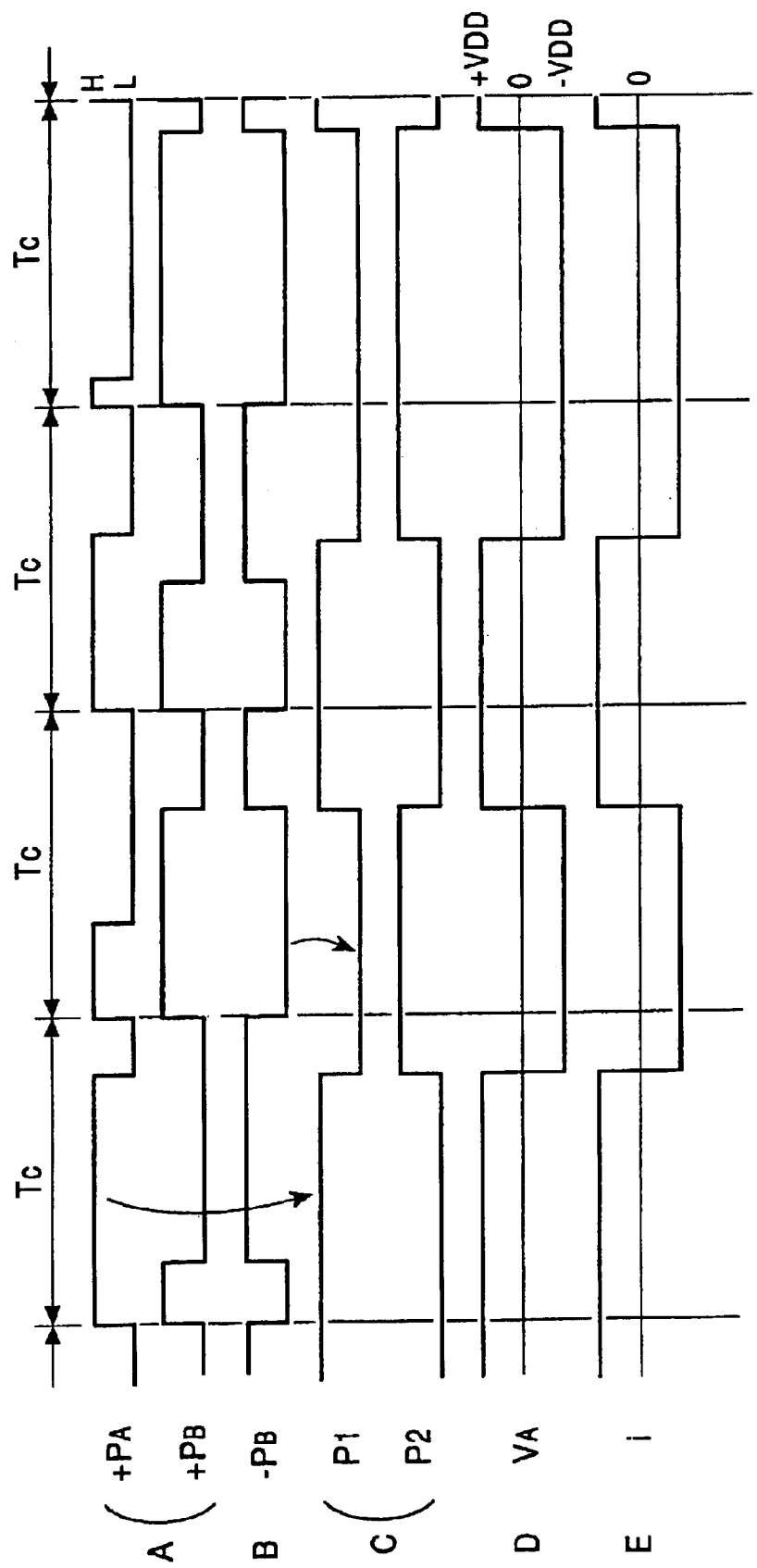
FIG. 8 is a waveform view used for describing a circuit shown in FIG. 7.

More specifically, in the power amplifier shown in FIG. 7, PWM signals +PA and +PB are output from PWM conversion circuits 11 and 12, as shown in FIG. 8A; the PWM signal +PA is sent to a drive circuit 13; the PWM signal +PB is sent to an inverter 145, and a PWM signal –PB having an inverted level as shown in FIG. 8B is generated; and the PWM signal –PB is sent to the drive circuit 13.

Then, the drive circuit 13 outputs drive voltages P1 and P2, and the drive voltages P1 and P2 are sent to a push-pull circuit 15. In this case, as shown in FIG. 8C, the drive voltage P1 is obtained by taking the PWM signal +PA and the PWM signal –PB alternately and at intervals equal to the cycle period Tc, and the drive voltage P2 is obtained by inverting the level of the drive voltage P1.

In the power amplifier shown in FIG. 7, the push-pull circuit 15 uses positive and negative power supplies. The drain of an FET (Q11) is connected to a positive-power-supply terminal TPWR+, and the source of an FET (Q12) is connected to a negative-power-supply terminal TPWR–. A pair of positive and negative DC voltages +VDD and –VDD are supplied to the power-supply terminals TPWR+ and TPWR– as power-supply voltages. The output end of the push-pull circuit 15 is connected to one end of a speaker 19 through a low-pass filter 17, and the other end of the speaker 19 is grounded.

Therefore, the output voltage VA of the push-pull circuit 15 has a shape such as that shown in FIG. 8D corresponding to the drive voltages P1 and P2. As shown in FIG. 8E, current "i" having a polarity and magnitude corresponding to an input signal Pin flows through the speaker 19, and electric power is amplified.

Also in this power amplifier, since the number of the rising edges and the falling edges of the drive voltages P1 and P2 is half the number of the rising edges and the falling edges of the PWM signals +PA and +PB, current flowing through the FETs (Q11 and Q12) are halved. In addition, since the frequency of the output voltage VA is halved, emission caused by the output voltage VA is also reduced.

Figure 9:
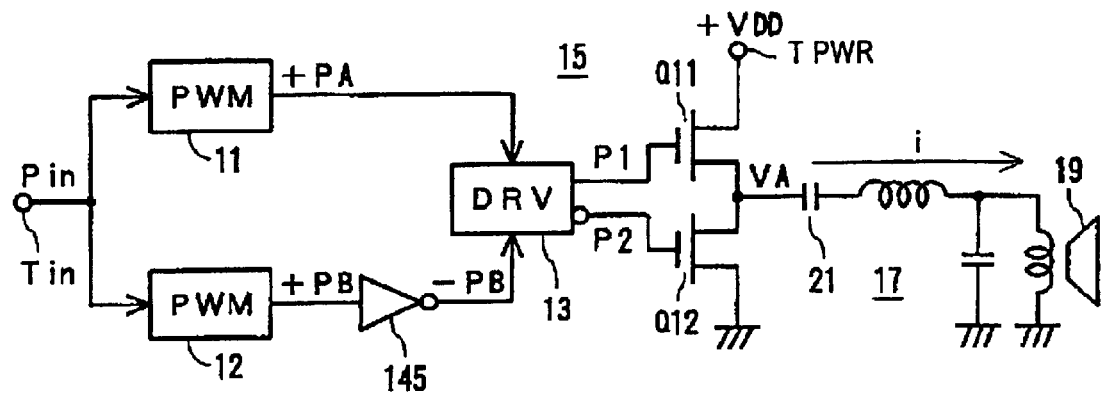
FIG. 9 is a systematic view showing another embodiment of the present invention.

A power amplifier shown in FIG. 9 has a single circuit at an output stage in the same way as the power amplifier shown in FIG. 7, and uses only a DC voltage +VDD as a power-supply voltage for a push-pull circuit 15. Therefore, in this case, for example, a DC-cut capacitor 21 is connected between the output end of the push-pull circuit 15 and a low-pass filter 17.

In the above description, the input signal Pin is a digital audio signal. The input signal Pin may be an analog audio signal. In addition, the PWM signals +PA, +PB, −PA, and −PB may be PNM (pulse number modulation) signals. Further, the PWM conversion circuits 11 and 12 can be formed of an increment counter, a decrement counter, and a comparison circuit.

In the data table of the ROMs 112 and 122, shown in FIG. 4, when the higher-order bits and the lower-order bits of the data at the addresses 0 to 63 are transposed in their bit arrangement, the data at the addresses 64 to 127 is obtained. Therefore, when the order of taking out data loaded into the shift registers 113 and 123 is switched between from the least significant bit D0 and from the most significant bit D63 is switched between the periods Tc when Pc="L" and the periods Tc when Pc="H" to reverse the time axis in each period Tc, the ROMs 112 and 122 need to have only the addresses 0 to 63. The capacity of the ROMs 112 and 122 can be halved.

Furthermore, in the above description, the power amplifiers are used as audio amplifiers. The power amplifiers can also be used as amplifiers for driving electric-power units such as motors. When any load is connected instead of the speaker 19, an operation voltage can be supplied to the load, and the level of the voltage supplied to the load can be changed by changing the input signal Pin. Therefore, the power amplifiers can also be used as variable power-supply circuits.

According to the present invention, since the number of the rising edges and the falling edges of the output voltage(s) is half the number of the rising edges and the falling edges of the PWM signals which generate the output voltage(s), emission caused by the change of the output voltage is reduced.

Therefore, even if a power amplifier according to the present invention is united with a receiver as in a car audio system or the power amplifier is disposed close to a receiver, disturbance given to broadcasting receiving, caused by the emission is reduced. In addition, with this, a member used for shielding a receiver from the emission can be eliminated, and cost is reduced. Further, since a receiver can be disposed closer to the power amplifier, space is also reduced.

Furthermore, since the number of the rising edges and the falling edges of the output voltage(s) is halved, the number of times current flows through a push-pull circuit or push-pull circuits used for generating the output voltage(s) are also halved. A loss in the power amplifier is reduced, and heat generated by devices is also suppressed. In addition, since the number of times the output switching element(s) perform switching is reduced, the deterioration of audio characteristics, caused by switching noise is also suppressed.

What is claimed is:

1. A power amplifier comprising:
pulse modulation means for supplying:
a first pulse signal obtained by outputting alternately, and at reference intervals equal to a reference period, a first pulse modulation signal (+PA) indicating a level of an input signal, and a second inverted pulse modulation signal (−PB) obtained by level-inverting a second pulse modulation signal which indicates a complement of the level of the input signal, and
a second pulse signal obtained by outputting alternately and at the reference intervals the second pulse modulation signal (+PB) indicating the complement of the level of the input signal and a first inverted pulse modulation signal (−PA) obtained by level-inverting the first pulse modulation signal which indicates the level of the input signal;

a first output circuit comprising a first switching element, supplying a switching output according to the first pulse signal supplied by from the pulse modulation means; and
a second output circuit comprising a second switching element, supplying a switching output according to the second pulse signal supplied by from the pulse modulation means, and
characterized in that a load is connected between an output end of the first output circuit and an output end of the second output circuit.

2. A power amplifier according to claim 1, wherein the pulse modulation means comprises:
a first pulse modulation circuit for converting the input signal to the first pulse modulation signal, indicating the level of the input signal, at the reference intervals to output it;
a second pulse modulation circuit for converting the input signal to the second pulse modulation signal, indicating the complement of the level of the input signal, at the reference intervals to output it;
a first inversion circuit for level-inverting an output of the first pulse modulation circuit to output the first inverted pulse modulation signal;
a second inversion circuit for level-inverting an output of the second pulse modulation circuit to output the second inverted pulse modulation signal;
a first selection circuit for selecting, alternately and at the reference intervals, the first pulse modulation signal and the second inverted pulse modulation signal to output the first pulse signal; and
a second selection circuit for selecting, alternately and at the reference intervals, the second pulse modulation signal and the first inverted pulse modulation signal to output the second pulse signal.

3. A power amplifier according to claim 1, wherein the pulse modulation means further comprises:
a memory for storing first pulse waveform data which indicates at least the level of the input signal, correspondingly to the level of the input signal; and
a control circuit for controlling reading from the memory, and
the control circuit changes reading from the memory, at the reference intervals, to output the first and second pulse signals.

4. A power amplifier according to claim 3, wherein:
the memory stores the first pulse waveform data which indicates the level of the input signal, and second pulse waveform data which indicates the complement of the level of the input signal, and
the control circuit controls reading from the memory so as to read alternately and at the reference intervals the first pulse waveform data and second inverted pulse waveform data obtained by level-inverting the second pulse waveform data, and so as to read alternately and at the reference intervals the second pulse waveform data and first inverted pulse waveform data obtained by level-inverting the first pulse waveform data.

5. A power amplifier according to claim 3, wherein:
the control circuit controls reading from the memory so as to read alternately and at the reference intervals the first pulse waveform data and reverse-order pulse waveform data obtained by reading the first pulse waveform data in a reverse order, and so as to read alternately and at the reference intervals second inverted pulse waveform data obtained by level-inverting the reverse-order pulse waveform data, and first inverted pulse waveform data obtained by level-inverting the first pulse waveform data.

6. A power amplifier according to claim 1, wherein the pulse modulation means comprises:

a first pulse modulation circuit for converting the input signal to the first pulse modulation signal, indicating the level of the input signal, at the reference intervals to output it;

a second pulse modulation circuit for converting the input signal to the second pulse modulation signal, indicating the complement of the level of the input signal, at the reference intervals to output it;

a first reverse circuit for reversing a time axis of the first pulse modulation signal to output a second time-reversed pulse modulation signal;

a second reverse circuit for reversing a time axis of the second pulse modulation signal to output a first time-reversed pulse modulation signal;

a first selection circuit for selecting, alternately and at the reference intervals, the first pulse modulation signal and the second time-reversed pulse modulation signal to output the first pulse signal; and a second selection circuit for selecting, alternately at the reference intervals, the second pulse modulation signal and the first time-reversed pulse modulation signal to output the second pulse signal.

7. A power amplifier according to claim 1, wherein:

the first and second output circuits are structured such that the first and second switching elements are push-pull-connected;

the first pulse signal and a first inverted pulse signal obtained by level-inverting the first pulse signal are sent to the first switching element of the first output circuit; and the second pulse signal and a second inverted pulse signal obtained by level-inverting the second pulse signal are sent to the second switching element of the second output circuit.

8. A power amplifier according to claim 1, wherein the first and second pulse modulation signals are PWM signals.

9. A power amplifier comprising:

pulse modulation means for supplying a pulse signal obtained by outputting alternately and at reference intervals equal to a reference period a first pulse modulation signal (+PA) indicating a level of an input signal and a second inverted pulse modulation signal (−PB) obtained by level-inverting a second pulse modulation signal which indicates a complement of the level of the input signal; and an output circuit comprising a switching element, for supplying a switching output according to the pulse signal supplied by the pulse modulation means and wherein a load is connected to an output end of the output circuit.

10. A power amplifier according to claim 9, wherein the pulse modulation means comprises:

a first pulse modulation circuit for converting the input signal to the first pulse modulation signal, indicating the level of the input signal, at the reference intervals to output it;

a second pulse modulation circuit for converting the input signal to the second pulse modulation signal, indicating the complement of the level of the input signal, at the reference intervals, and for level-inverting it to output a second inverted pulse modulation signal; and a selection circuit for selecting, alternately and at the reference intervals, the first pulse modulation signal and the second inverted pulse modulation signal to output the pulse signal.

11. A power amplifier according to claim 9, wherein the pulse modulation means further comprises:

a memory for storing first pulse waveform data which indicates at least the level of the input signal, correspondingly to the level of the input signal; and a control circuit for controlling reading from the memory, and the control circuit changes reading from the memory, at the reference intervals to output the pulse signal.

12. A power amplifier according to claim 11, wherein:

the memory stores the first pulse waveform data, which indicates the level of the input signal, and second pulse waveform data which indicates the complement of the level of the input signal, and the control circuit controls reading from the memory so as to read alternately and at the reference intervals, the first pulse waveform data and second inverted pulse waveform data obtained by level-inverting the second pulse waveform data.

13. A power amplifier according to claim 11, wherein:

the control circuit controls reading from the memory so as to read alternately and at the reference intervals, the first pulse waveform data and reverse-order pulse waveform data obtained by reading the first pulse waveform data in a reverse order.

14. A power amplifier according to claim 9, wherein the pulse modulation means comprises:

a pulse modulation circuit for converting the input signal to the first pulse modulation signal, indicating the level of the input signal, at the reference intervals to output it;

a time reverse circuit for reversing a time axis of the first pulse modulation signal to output a time-reversed pulse modulation signal; and a selection circuit for selecting, alternately and at the reference intervals, the first pulse modulation signal and the time-reversed pulse modulation signal to output the pulse signal.

15. A power amplifier according to claim 9, wherein:

the output circuit is structured such that a pair of switching elements are push-pull-connected, and the pulse signal and an inverted pulse signal obtained by level-inverting the pulse signal are sent to the pair of switching elements of the output circuit.

16. A power amplifier according to claim 9, wherein the first and second pulse modulation signals are PWM signals.

* * * * *